United States Patent [19]

Niki

[11] 3,932,814
[45] Jan. 13, 1976

[54] HETERODYNE RECEIVER SYSTEM

[75] Inventor: Shoji Niki, Gyoda, Japan

[73] Assignee: Takeda Riken Kogyo Kabushikikaisha, Tokyo, Japan

[22] Filed: May 20, 1974

[21] Appl. No.: 471,635

[30] Foreign Application Priority Data
   May 28, 1973   Japan.............................. 48-59980

[52] U.S. Cl.................................. 325/332; 325/335
[51] Int. Cl.².......................................... H04B 1/36
[58] Field of Search........................... 325/330–337, 325/346, 416–420, 423, 436, 437, 438, 453, 457, 484

[56] References Cited
UNITED STATES PATENTS

| | | | |
|---|---|---|---|
| 3,110,861 | 11/1963 | Hurvitz................. | 325/335 |
| 3,381,243 | 4/1968 | Darlington............ | 325/332 |
| 3,391,348 | 7/1968 | Kohler.................. | 325/335 |
| 3,492,584 | 1/1970 | Takahashi............. | 325/335 |
| 3,504,294 | 3/1970 | Martin, Jr............. | 325/335 |
| 3,701,949 | 10/1972 | Turkish................. | 325/332 |

*Primary Examiner*—Benedict V. Safourek
*Assistant Examiner*—Jin F. Ng
*Attorney, Agent, or Firm*—Elliott I. Pollock

[57] ABSTRACT

An input signal and a local oscillator signal are supplied to a harmonic mixer. The local oscillator signal is swept over a frequency range. The output from the harmonic mixer is supplied to an intermediate frequency filter having a preselected frequency response, which provides an output signal when the difference formed by subtracting one of the input signal frequency and one harmonic frequency of the local oscillator signal from the other is equal to the intermediate frequency or when the difference formed by subtracting the other frequency from said one frequency is equal to the intermediate frequency as the local oscillator frequency is swept. By choosing a time interval between the times when the pair of intermediate frequency output signals are obtained, the order of that harmonic of the local oscillator signal with which the intermediate frequency output signal is obtained is determined depending on the frequency of the input signal. Thus, with a chosen time interval, when the frequency sweep of the local oscillator signal is interrupted with the later occurring one of the pair of the intermediate frequency output signals, the frequency of the local oscillator permits, together with the order of selected harmonic which corresponds to the chosen time interval and the direction of the frequency sweep, the frequency of the input signal to be determined. By using a definite time interval between the pair of intermediate frequency signals obtained and adjusting the rate of the frequency sweep, the order of the harmonic which is effective to obtain the intermediate frequency signals can be varied.

22 Claims, 18 Drawing Figures

HETERODYNE RECEIVER SYSTEM

BACKGROUND OF THE INVENTION

The invention relates to a heterodyne receiver system incorporating a harmonic mixer, and more particularly to such system which is adapted to receive a sum or difference conversion with a specified order of harmonic automatically.

When determining the frequency of an input signal by counting it in a counter, the operational limit of flipflops involved imposes a practical limit on the order of 1000 MHz. A signal of higher frequency can not be directly counted for the determination of the frequency. Where it is desired to determine a frequency in excess of 1000 MHz by means of a counter, a crystal oscillator is used to produce harmonics, one of which is selected by a tuning circuit for the purpose of the frequency conversion of the input signal, with the converted signal of lower frequency being supplied to the counter in order to determine the frequency of the input signal from the count thereof. Generally, the frequency of the input signal is unknown, rendering it impossible to choose any particular harmonic to be supplied to the frequency conversion circuit. Consequently, the tuning frequency of the tuning circuit is varied from a lower order to a higher order harmonic to provide a frequency output which may be used in a sequential operation, which requires an increased time length for the determination of the frequency. Another proposal has been to supply the input signal and a local oscillator signal to a harmonic mixer so that the difference between the input signal frequency and the frequency of the local oscillator or a harmonic thereof may be obtained. As understood, when representing the frequency of the input signal by Fs, the frequency of the local oscillator signal by Fl and the frequency of the converted intermediate frequency by Fi, the following relationship applies:

$$Fs = nFl \pm Fi$$

In this equation, $n$ represents a positive integer which indicates the order of harmonic of the local oscillator signal, and $n = 1$ for the fundamental wave. Where the frequency determination is based on such relationship, it is necessary to know the particular value of $n$ and the sign appearing in the equation, and for this purpose it has been the practice in the prior art to vary the frequency of the local oscillator signal Fl by a small frequency increment $\Delta f$ to see the resulting variation of Fi or $\pm n \Delta f$ when an approximate expected value of the input signal frequency Fs is used in combination with several values of Fl and $n$. However, the procedure is complicated and in addition involves the possibility that the determination of $n$ and the sign may be inaccurate.

It is therefore an object of the invention to provide a heterodyne receiver system incorporating a harmonic mixer in which the order of harmonic of the local oscillator signal and the sign in the mixing process may be determined in a simple and reliable manner.

It is another object of the invention to provide a heterodyne receiver system capable of receiving input signals over an extensive frequency range.

It is a further object of the invention to provide a heterodyne receiver system which automatically traps an input signal.

It is still another object of the invention to provide a heterodyne receiver system which permits the frequency of an input signal to be determined accurately and which operates in a stable manner.

It is a still further object of the invention to provide a heterodyne receiver system which is free from the influence of noises to trap an input signal and to determine the frequency thereof.

It is an additional object of the invention to provide a heterodyne receiver system in which the order of harmonic of the local signal is automatically switched.

It is a still additional object of the invention to provide a heterodyne receiver system which traps an input signal and determines its frequency by an arithmetic operation.

It is a further object of the invention to provide a heterodyne receiver system capable of displaying the input signal alone or in combination with accompanying signals.

SUMMARY OF THE INVENTION

In accordance with the invention, an input signal and a local oscillator signal which is swept over a frequency range are both supplied to a harmonic mixer. The harmonic mixer provides an intermediate frequency output at distinct, spaced times in response to the same order of harmonic of the local oscillator frequency which is being swept. The one of the intermediate frequency outputs signals which occurs later in time is used to interrupt the frequency sweep of the local oscillator signal. In one embodiment, a single local oscillator of the type in which the frequency is swept over a frequency range is used together with a single harmonic mixer, and the order of harmonic is determined by choosing a time interval from the instant when the local oscillator frequency or its harmonic assumes a frequency of $Fs - Fi$ (or $Fs + Fi$) to the instant when it assumes a frequency of $Fs + Fi$ (or $Fs - Fi$), while the sign in the frequency conversion process is determined depending on whether the frequency sweep is interrupted at the frequency of $Fs + Fi$ or $Fs - Fi$, or in other words, whether the frequency sweep proceeds from the higher to lower frequency or in the opposite direction. When the frequency sweep of the local oscillator is interrupted by the one of the intermediate frequency signals which occurs later in time, the prevailing frequency of the local oscillator permits the frequency of the input signal to be determined in combination with the order of harmonic which is determined by the chosen time interval as well as the sign determined in the manner described above.

The frequency sweep of local oscillator may be achieved by using a sawtooth wave generator, and a voltage controlled oscillator having a variable oscillation frequency which is controlled by the sawtooth wave voltage. The sawtooth wave voltage generator may be arranged such that it responds to clock pulses to produce an output voltage which varies in the manner of a step function, varying by one step for each clock pulse applied, the stepped wave voltage providing an equivalent sawtooth wave voltage. Such a stepped wave voltage may be produced by a counter which counts the clocks, and a D-A converter which converts the counter output into a corresponding analog voltage. The frequency swept local oscillator signal and the input signal are supplied to a harmonic frequency converter in which the input signal and the local signal as well as its harmonic signal are subjected to frequency conversion, and the resulting intermediate frequency signal is selected by a filter, the output of which is detected subsequently. The frequency sweep of the local oscillator is interrupted by the later occurring one of the pair of the intermediate frequency signal outputs which are obtained at a chosen time interval with respect to each other determined by the order of harmonic. To this end, a time counter is provided to initiate the counting of clock pulses from an initial condition when the first intermediate frequency output is obtained. When a predetermined count is reached, it opens an output election gate for a given period of time for passing the next occurring intermediate frequency output after it has been detected. The passed output interrupts the counting operation in the time counter and also interrupts the operation of the overall system, thus interrupting the frequency sweep. By choosing a given count at which an output is obtained from the time counter, the order of harmonic which functions to provide the pair of intermediate frequency outputs is determined. By using the same clock for feeding the time counter and the sawtooth wave generator, it is assured that the operation is not influenced by the fluctuations in the clock frequency. Also, it is possible to determine the frequency of the input signal in an accurate manner by sweeping the local oscillator frequency at a high rate until the input signal is trapped, whereupon the sweep is reversed and continued at a lower rate. In addition, the use of a high precision oscillator such as a crystal oscillator for the clock oscillator is avoided and a more inexpensive oscillator having a poor frequency stability may be used.

The order of harmonic selected may be varied by the choice of a count of the time counter at which an output is obtained therefrom, or alternatively by maintaining such count constant and changing the period of time over which the frequency sweep is effected, or by changing the slope of the sawtooth wave relative to the number of clocks supplied. To this end, the sawtooth wave voltage supplied to the voltage controlled oscillator may be divided in a variable voltage divider to change the voltage division ratio in accordance with the selection of the order of harmonic. Alternatively, the clock supplied to the sawtooth wave generator may be frequency divided, with the ratio of the frequency division being varied with the selection of the order of harmonic. It is also possible to change the ratio of the frequency division of the clock supplied to the time counter in accordance with the selection of the order of harmonic. The order of harmonic selected may be automatically changed where a counter is used in the sawtooth wave generator, by supplying the output from the final stage of that counter or so-called carry output to the counter which determines the order of harmonic, as a count pulse thereto. If the determination of the frequency of the input signal fails for a selected order of harmonic, that is, if no intermediate frequency output is obtained when a given count is reached in the time counter, the system is not interrupted but the counter within the sawtooth wave generator reaches the full count, whereupon it recycles the counting from 0. The carry pulse which is produced at such time advances by one step the counter which determines the order of harmonic. The content in this counter modifies the ratio of voltage division for the sawtooth wave voltage. In this manner, the order of harmonic selected is automatically changed until a pair of intermediate frequency signals corresponding to the input signal frequency are obtained in a time interval determined by the given count in the time counter.

The oscillation frequency of the local oscillator at the time the system is interrupted by an output derived from the output electron gate is determined, and such frequency is multiplied by a number equal to the order of harmonic selected. On the other hand, the intermediate frequency is determined, and used in combination with the local oscillator frequency multiplied by the order of harmonic to calculate the frequency of the input signal in an arithmetic unit for digital display. Instead of interrupting the system operation by the output from the output electron gate, such output or an intermediate frequency detected output corresponding thereto may be supplied to a vertical deflection circuit for a cathode ray tube, the horizontal deflection circuit of which may be supplied with the sawtooth wave voltage to provide the display by the tube. In a modification of such display using a cathode ray tube, the intermediate frequency detected output may be supplied to the vertical deflection circuit while the output from the output electron gate may be used to provide a brightness modulation so that the input signal may be displayed with an increased brightness against the background signals.

Where the sweep of the local oscillator involves an inertia effect or tendency to continue its frequency change after the signal to interrupt the sweep is applied, the sweep may be effected at a high rate to search for the input signal, and the sweep of the local oscillator may be reversed when an output is obtained from the output election gate, concurrently with a reduction in the frequency of clocks supplied thereto to reduce the sweeping rate. When the intermediate frequency output is obtained under the condition, the time counter is reset, and at the next time another output is obtained from the output election gate, the system is interrupted to determine an accurate frequency of the local oscillator which corresponds to the frequency of the input signal.

As a further alternative, a frequency swept oscillator and a harmonic mixer may be used in combination in a manner such that the output intermediate frequencies from the harmonic mixer are different from each other, which may be considered as *Fia* and *Fib*. The order of harmonic of the local oscillator signal as well as the sign in the frequency conversion process can be determined from the direction of sweep as well as the time interval from the instant the frequency of the local oscillator or its harmonic frequency is equal to *Fs* + *Fia* (or *Fs* − *Fia*) to the instant it becomes equal to *Fs* + *Fib* (or *Fs* − *Fib*). In either case, a choice is made of the time interval from the instant the local oscillator frequency assumes a first frequency to the instant it assumes a second frequency, at both of which the intermediate frequency signals are obtained, which are reception outputs corresponding to the order of harmonic of the local oscillator frequency associated with the time interval chosen as well as the sign of ±. By interrupting the frequency sweep of the local oscillator with one of the intermediate frequency outputs which occurs later in time, the signal which has been subjected to frequency conversion with that order of harmonic and the sign continues to be received.

DESCRIPTION OF PREFERRED EMBODIMENTS

Figure 1:
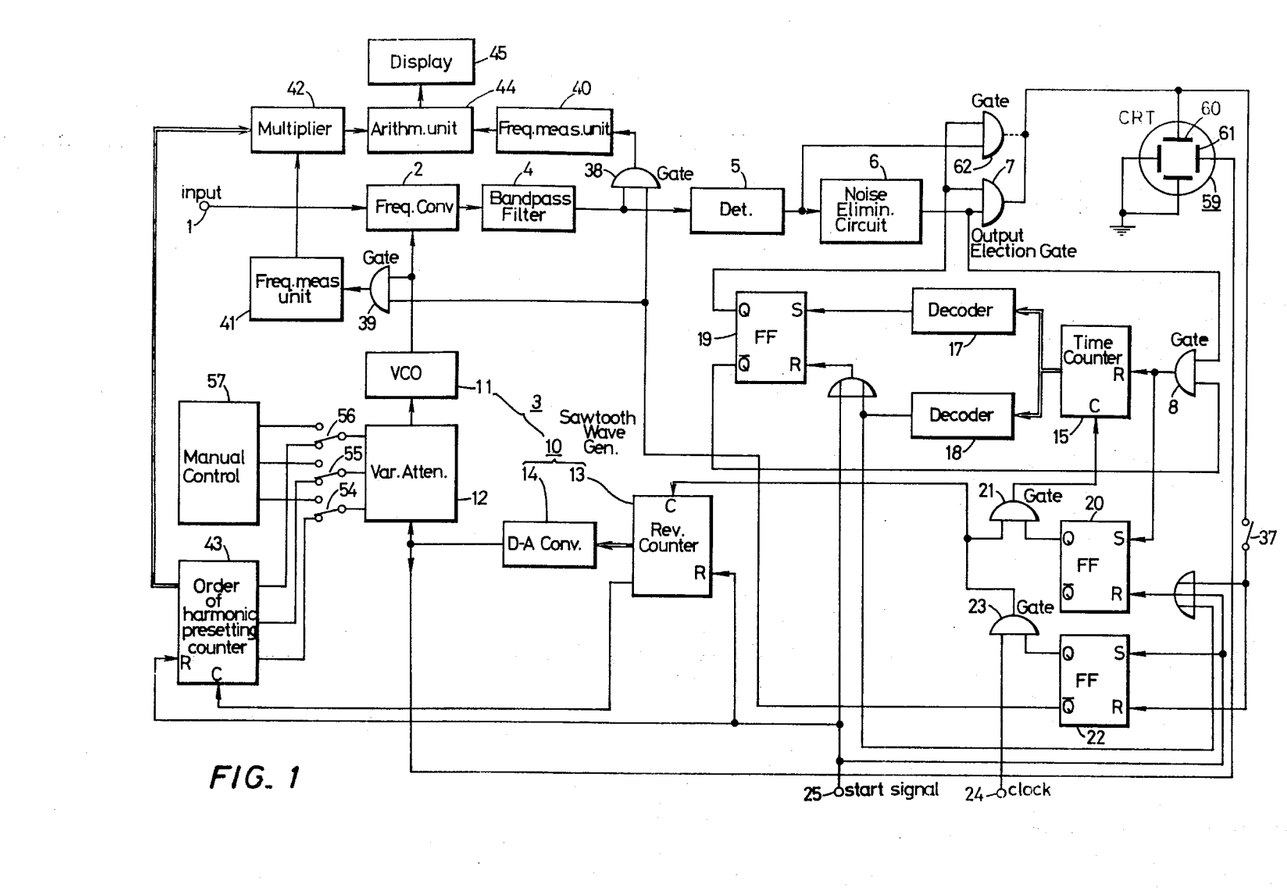
FIG. 1 is a block diagram of one embodiment of the heterodyne receiver system according to the invention.

Referring to FIG. 1 initially, an input signal having a frequency Fs to be determined is supplied to an input terminal 1 and fed thence to a frequency converter 2, which is also supplied with a local oscillator signal having a frequency of Fl from a frequency swept local oscillator 3. The frequency converter 2 is a so-called harmonic mixer which utilizes the non-linearity of a diode or transistor, for example, and the input signal and the local oscillator signal or its harmonic is frequency mixed in the converter 2 to provide an intermediate frequency signal having a frequency of $Fi = Fs - nFl$, which is supplied to a bandpass filter 4, $n$ being a positive integer. The intermediate frequency signal is detected in a detector 5, the output of which is passed through a noise elimination circuit 6 for elimating noises below a given level, and is subsequently supplied to an output election gate 7 and another gate 8, respectively.

In the present example, the frequency swept local oscillator 3 comprises a sawtooth wave generator 10 and a voltage controlled oscillator 11 having a variable oscillation frequency which is controlled by the output voltage from the generator 10. The output of the sawtooth wave generator is passed through a variable attenuator circuit 12 before being supplied to the oscillator 11. The attenuator circuit 12 serves to chose an order of harmonic. In the example shown, the sawtooth wave generator 10 produces an equivalent sawtooth wave in the form of stepped voltage, and comprises a reversible counter 13 having its output connected with a D-A converter 14 for conversion into an analog voltage. A conventional D-A converter 14 may be used. By way of example, a plurality of current sources having respective weights corresponding to the digits of a binary code are provided in series with switches which are connected with the corresponding binary digits of the counter 13, thereby providing a voltage of a level which corresponds to the count in the counter 13. For example, the stepped wave voltage may vary over 10 volts by counting ($2^{16}-1$) clocks.

The filter 4 provides the intermediate frequency outputs at different times which correspond to the instants when the same order of harmonic of the oscillation output is produced from the local oscillator 3 as its frequency is swept, and the frequency sweep of the local oscillator 3 is interrupted by one of these outputs which occurs later in time. To this end, in the arrangement of FIG. 1, when one of the intermediate frequency outputs is obtained, the time counter 15 initiates counting the clocks, and when a given count is reached therein, the output election gate 7 is opened for a given period of time for passing any subsequent output from the noise elimination circuit 6, that is, the later occurring intermediate frequency output, if it occurs, thereby interrupting the operation of the overall system. To perform such an operation, the output of the time counter 15 is applied to a pair of decoders 17 and 18 which provide outputs at values of the count in the counter 15 which are slightly less and greater than the given count, respectively. In this manner, the output from the counter 15 when it has reached the given count represents an output having a time width which is centered about the given count. The pair of decorders may be replaced by a single monostable multivibrator which produces an output pulse of a given width in response to a given count. The outputs from the decoders 17, 18 are supplied to the set input and the reset input of a flipflop 19, respectively. The reset output $\overline{Q}$ of the flipflop 19 is supplied to the gate 8 as a gating signal, and the output of the gate 8 is supplied to the set input of a flipflop 20. The set output Q of the flipflop 20 is supplied to a gate 21, as a gating signal. The output from the output election gate 7 is applied to the reset input of flipflops 20, 22, and the set output Q of the flipflop 22 is supplied to a gate 23, as a gating signal. The gate 23 is supplied with a clock from a terminal 24. The output clock from the gate 23 is supplied as a count input to the counter 13 in the sawtooth wave generator 10, and is also supplied as a count input to the time counter 15. A start signal from a terminal 25 rests the counter 13 and the flipflops 19, 20, and sets the flipflop 22.

Figure 2A:
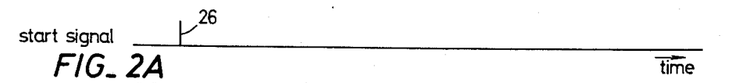
FIGS. 2A to 2J show waveforms for illustrating the operation of the system.
Figures 2B, 2C:
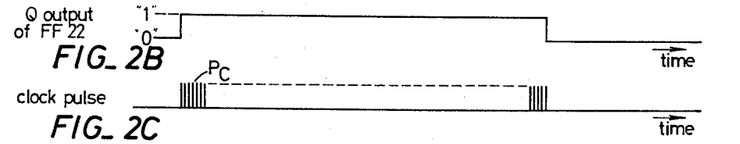
Figure 2D:
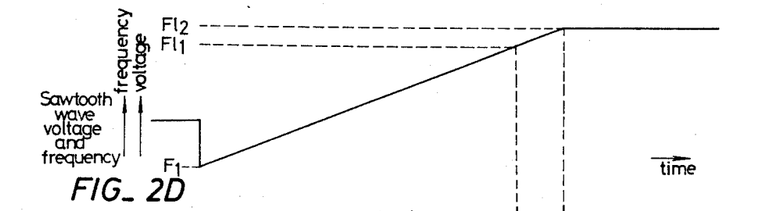
Figure 2E:
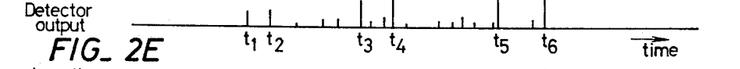

When the start signal 26 is supplied from the terminal 25, as shown in FIG. 2A, the flipflop 22 is set, with its set output assuming a high level as shown in FIG. 2B, whereby the gate 23 is opened to pass the clock pulse $P_c$ from the terminal 24, as shown in FIG. 2C, to be supplied to the counter 13 in order to be counted therein. As a result, an increasing sawtooth wave voltage in the form of a stepped function is produced by the D-A converter 14. The increment of one step in the sawtooth wave voltage is very small, and accordingly the output from the converter 14 is shown in FIG. 2D as a continuous sawtooth wave voltage. Assuming that the attenuation in the attenuator 12, which operates to select the order of harmonic as will be described later, is preset to zero, the voltage shown in FIG. 2D is supplied to the oscillator 11, the oscillation frequency of which increases gradually beginning from a frequency $F_1$, for example, thereby sweeping the frequency of the oscillator 11. The local oscillator signal and its harmonics as well as the input signal are frequency mixed in the frequency converter 2, and the component in its output which has the frequency Fi is passed through the intermediate frequency filter 4 to be detected by the detector 5, thereby providing a pulse output as shown in FIG. 2E. Noises in the detected output which are below a given level are eliminated by the circuit 6.

Figure 2F:
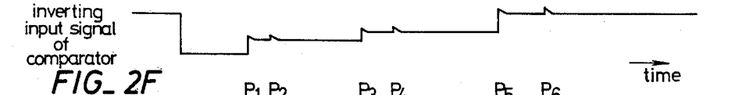
Figures 2G, 2H:
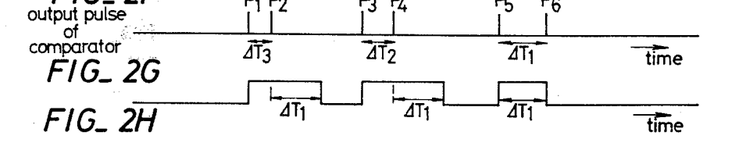
Figure 3:
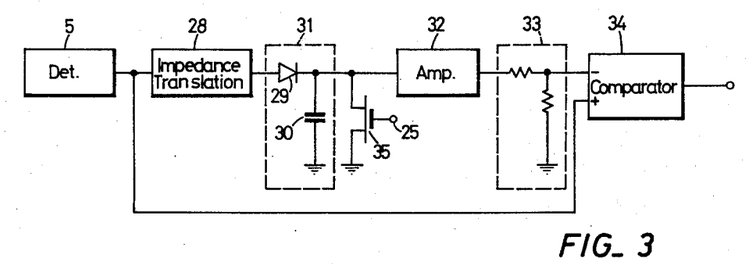
FIG. 3 is a circuit diagram showing one example of the noise elimination circuit.
Figure 4:
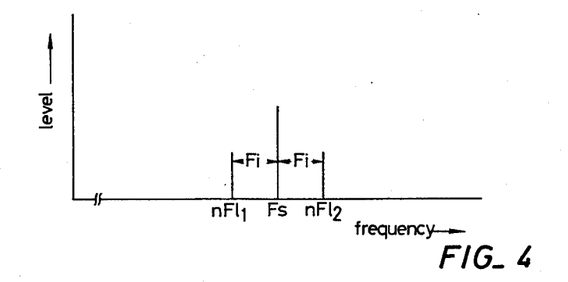
FIG. 4 is a diagram of frequency spectrum showing the relationship between the input signal frequency and the harmonic of the local oscillator signal which is used for the frequency conversion.

The noise elimination circuit 6 may be constructed as shown in FIG. 3, for example, wherein the output of the detector 5 is supplied through an impedance translating circuit 28 to a peak rectifier 31 which comprises a diode 29 and a compactitor 30. The peak rectified output is fed to an amplifier 32 having the gain of unity and thence to a voltage divider 33 which reduces the output level to 80 percent before supplying it to the inverting input terminal of an operational amplifier 34 which forms a conparator. The output of the detector 5 is also directly supplied to the non-inverting input terminal of the amplifier 34. In actuality, the capacitor 30 in the peak rectifier 31 is not fully charged, and because of the presence of leakage, the voltage divider 33 may be omitted. An electronic switch in the form of a field effect transistor 35 is connected in shunt with the capacitor 30, and the start signal 26 from the terminal 25 (FIG. 1) is applied to the gate of the transistor 35 to turn it on, thereby discharging the capacitor 30 to a null level. While not shown, a bias is applied to the comparator 34 in order to assure that the output thereof assumes a lower level of 0 when the output of the detector 5 is at zero level even though the output from the amplifier 32 may be zero. Consequently, as shown in FIG. 2F, upon application of the start signal 26, the inverting input terminal of the comparator 34 receives zero input and is charged substantially to the peak value of the output pulse from the detector 5 at time $t_1$, but the level prevailing at the non-inverting input terminal is higher, whereby the output assumes a high level of 1. However, the output pulse from the detector 5 at time $t_1$ collapses rapidly, so that the level at the inverting input terminal of the comparator 34 changes to a high level immediately, whereby the output assumes a low level of 0, thus producing a pulse as shown in FIG. 2G. In this manner, the inverting input terminal of the comparator 34 receives a signal as shown in FIG. 2F, and its output will be pulses of a constant level as shown in FIG. 2G, which correspond to pulses exceeding a given level in the ouput (FIG. 2E) of the detector 5 obtained in response to the intermediate frequency signal. This output of the comparator 34 provides the output of the noise elimination circuit 6.

Where the local signal frequency of the local oscillator 3 is swept at a constant rate of $t$ (seconds) per Hertz so as to increase the frequency from $F_1$ to a gradually higher frequency, it will be appreciated from FIG. 4 that when the local oscillator frequency assumes a frequency of $Fl_1$, $n$ times such frequency minus the input signal frequency Fs becomes equal to the intermediate frequency $Fi$, and subsequently when the local signal frequency becomes equal to $Fl_2$ which is higher than $Fl_1$, the difference between the frequency, $nFl_2$, of the same order of harmonic thereof and the input signal frequency Fs will be again equal to $Fi$, thus producing the intermediate frequency output again. Thus, $$Fs = nFl_1 + Fi \quad (2)$$
$$Fs = nFl_2 - Fi \quad (3)$$

Substration of the equation (2) from the equation (3) yields:

$$n(Fl_2 - Fl_1) = 2Fi \quad (4)$$

On the other hand, the time interval $T_1$ required from the initiation of the sweep until the swept frequency reaches $Fl_1$ is equal to $(Fl_1 - F_1)t$ while the time interval $T_2$ until $Fl_2$ is reached is equal to $(Fl_2 - F_1)t$, so that the time interval $\Delta T$ required to pass from $Fl_1$ to $Fl_2$ is represented as follows:

$$\Delta T = T_2 - T_1 = t(Fl_2 - Fl_1) \quad (5)$$

Substituting this relationship into equation (4) yields:

$$n \frac{T_2 - T_1}{t} = 2Fi \text{ or } n = \frac{2tFi}{\Delta T} \quad (6)$$

As mentioned previoualy, $T_2$ and $T_1$ represent the time when the intermediate frequency signal is obtained by the same order of harmoincs of the local oscillator signal, it will be understood that when $Fi$ and $t$ are predetermined, there is a one-to-one correspondence between $n$ and $\Delta T$, so that if the time interval $\Delta T = T_2 - T_1$ is fixed, the order of harmonic, $n$, of the local oscillator signal which is to be frequency mixed with the input signal in order to obtain the intermediate frequency signal can be determined. Since the value of $n$ is decided once the time interval $\Delta T$ is fixed, the reception frequency is limited by such relation to $Fs = nFl \pm Fi$. For example, when the input signal frequency Fs is equal to 12.5 GHz, the frequency range over which the local oscillator frequency is swept is from $F_1 = 2$ GHz to $F_2 = 4$ GHz ($F_2$ being the maximum frequency in the frequency sweep range), and $Fi$ is equal to 0.02 GHz, it will be appreciated that the intermediate frequency signals can be obtained for values of $n$ which are listed in the Table 1 below, namely for $n = 4$, 5 and 6.

Table 1

| Fl(GHz) | n |
|---------|---|
| 2.08    | 6 |
| 2.496   | 5 |
| 3.12    | 4 |

Figure 2I:
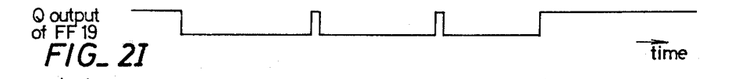

However, it will be also noted that the time interval $T_2 = T_1$ required from the first acquistion until the next acquisition of the intermediate frequency signals, which are represented by $\Delta T_1$, $\Delta T_2$ and $\Delta T_3$ in FIG. 2G for $n = 4$, 5 or 6, is reduced progressively. Consequently, if the time interval $\Delta T_1$ corresponding to $n = 4$ is chosen for the time interval $\Delta T$ from the initiation of the counting in the time counter 15 until a given count is reached therein to cause the output of the decoder 17 to set the flipflop 19 to enable the gate 7, only the intermediate frequency signal which is produced as a result of the frequency mixing of the input signal with the fourth harmonic of the local oscillator signal will be obtained from the output election gate 7 of FIG. 1. Specifically, referring to FIG. 2, when the frequency sweep of the local oscillator 3 has proceeded to a point such that at time $t_1$ the sixth harmonic corresponding to $n = 6$ is produced, the difference between the frequency of such harmonic or 6 × 2.08 GHz and the input signal frequency 12.5 GHz becomes equal to $Fi = Fs - 6Fl_1 = 0.02$ GHz, whereby an output is obtained from the bandpass filter 4. As a result, at time $t_1$, a pulse $P_1$ from the circuit 6 passes through the gate 8 to reset the time counter 15 and also resets the flipflop 20, whereby the gate 21 is enabled as shown in FIG. 2H. This permits the clock to be passed therethrough, and the counter 15 initiates its counting from zero. The gate 8 is enabled by the reset output $\overline{Q}$ of the flipflop 19 when it is reset by the start signal 26. At time $t_2$ which is before the elapse of $\Delta T_1$ from the time $t_1$ or before a given count is reached in the counter 15, the local oscillator frequency $Fl$ becomes equal to 2.086 GHz, so that $Fi = 6Fl_2 - Fl$ becomes equal to 0.02 GHz, thereby producing an intermediate frequency signal from the filter 4. Because the output election gate 7 is not opened at this time, the counter 15 is reset by a pulse $P_2$ obtained at this time $t_2$ from the circuit 6, thus reinitiating the counting from zero. After the elapse of $\Delta T_1$ from the time $T_2$ when the given count is reached in the counter 15, an output is obtained from the decoder 17 which sets the flipflop 19. As shown in FIG. 2I, the gate 7 is enabled. Subsequently when the counter 15 goes on its counting for a few clocks, the output from the decoder 18 resets the flipflop 19 to disable the gate 7. During the period when the gate 7 is enabled, no detected intermediate frequency output is obtained from the circuit 6. When the gate 7 is disabled, the output from the decoder 18 resets the flipflop 20, whereby the gate 21 is disabled to interrupt the supply of clocks to the counter 15.

As the sweep of the local oscillator frequency $Fl$ goes on, the intermediate frequency output is obtained at time $t_3$ for the fifth harmonic, and the resulting detected output pulse $P_3$ resets the time counter 15 in the same manner as mentioned above, the counter initiating its counting from zero. However, at time $t_4$ which is before the given count is reached therein, another intermediate frequency output for the fifth harmonic is obtained and the resulting pulse $P_4$ from the circuit 6 resets the counter 15. After $\Delta T_1$ corresponding to the counting of the given count, the gate 7 is enabled, but no intermediate frequency output is obtained in such interval.

Figure 2J:
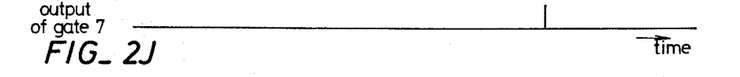

However, at time $t_5$ when $Fl$ becomes equal to 3.12 GHz, the intermediate frequency output corresponding to the fourth harmonic or $n = 4$, is obtained. The resulting detected output pulse $P_5$ resets the time counter 15 and also sets the flipflop 20, whereby the clock is supplied to the counter 15 to initiate its counting. By the time the given count is reached to set the flipflop 19 to thereby enable the output election gate 7, the time interval $\Delta T_1$ has elapsed since the time $t_5$, and at such time $t_6$, the output pulse $P_6$ is obtained from the circuit 6 as a result of the detection of the intermediate frequency signal, and is passed through the gate 7 as shown in FIG. 2J, the pulse being fed through a normally closed switch 37 to the reset terminals of the flipflops 20, 22 to thereby reset these flipflops. Such resetting operation disables the gate 21, 23, so that the clock from the terminal 24 is no longer supplied to the entire system, whereby the operation of the overall system is interrupted, including the frequency sweep of the local oscillator 3. Since the choice of $\Delta T_1$ is such that the harmonic which was effective to produce the intermediate frequency output for the given input signal was the fourth harmonic or $n = 4$, and since the frequency sweep has been in the direction of increasing frequency, it will be noted from the equations (2) and (3) that the pulse $P_5$ is obtained when the frequency of the local oscillator reaches a frequency $Fl_1$ of value such that $4Fl_1 + Fi = Fs$ and the pulse $P_6$ is obtained when the frequency of the local oscillator reaches a frequency $Fl_2$ of the value such that $4Fl_2 + Fi = Fs$ at which time the sweep is interrupted, thus allowing the oscillator 3 to continue its oscillation at the frequency of $Fl_2$. By the measurement of the frequency $Fl_2$, the known values of $n$ and $Fi$ permits the input signal frequency $Fs$ to be determined according to the equation (3).

In order for the input signal frequency to be determined automatically, the arrangement of FIG. 1 includes a pair of gates 38 and 39 which are enabled by the reset output $\overline{Q}$ of the flipflop 22 when it is reset by the pulse from the output election gate 7. The output of the intermediate frequency filter 4 is supplied through the gate 38 to an intermediate frequency measuring unit 40 which is operative to determine the output frequency $Fi$ of the intermediate frequency filter 4. The output of the oscillator 11 is supplied through the gate 39 to another frequency measuring unit 41 which is operative to determine the oscillation frequency $Fl_2$.

The value determined in the measuring unit 41 is supplied to a multiplier 42 where it is multiplied by a number corresponding to the prevailing order of harmonic, $n$, the multiplier 42 receiving a conditioning signal from a circuit 43 which presets an order of harmonic for the order of harmonic choosing attenuator 12. The multiplied output $nFl_2$ and the measured value $Fi$ from the circuit 40 are supplied to an arithmetic unit 44 to calculate $nFl_2 - Fi = Fs$ according to the equation (3). The resulting $Fs$ is displayed in a digital display 45. The measuring unit 40 may comprise a counter, for example. Since the value of $Fl_2$ is significantly lower as compared with $nFl_2$, the measuring unit 41 may also comprise a counter. Alternatively, the local oscillator frequency may be converted into a lower frequency before it is counted, as desired. While not shown, the circuits 40, 41, 44 and 45 may be reset to the respective initial condition by the start signal from the terminal 25, if required. While the frequency which is to be passed through the filter 4 is previously established, it is impossible in actuality to restrict the passband to a single frequency, so that the intermediate frequency $Fi$ which prevails in the operation of the system actually has a certain width, and it is such frequency which is determined in the measuring unit 40.

In this manner, the order of harmonic n is determined, and any input signal having the frequency Fs which satisfies the relationship of the equations (2) and (3) during the frequency sweep for such value of n can be trapped to thereby interrupt the operation of the system. However, when an input signal of a frequency band which is determined by the order of harmonic n does not exist, the frequency sweep of the oscillator 3 will be continued until the maximum oscillation frequency $F_2$ is reached or the counter 13 for producing the sawtooth wave in FIG. 1 reaches a full count, whereupon the following clock resets it to zero, whereby the counting is repeated. In other words, the sawtooth wave voltage will return to zero and begins to increase again for performing the frequency sweep of the oscillator 3 again. During the repeated frequency sweep, the order of harmonic will be increased to either $n + 1$ or $n - 1$. For example, $n = 5$ is chosen in the above example. To this end, the decoders 17 and 18 associated with the time counter 15 may be chosen such that the time interval $\Delta T_2$ from the pulse $P_3$ to pulse $R_4$ shown in FIG. 2G is equal to a period of time from the initiation of the counting operation of the counter 15 until the set output of the flipflop 19 is obtained as a gating signal. The higher the order of harmonic established, the broader the frequency range across which the input signal can be trapped. However, in order to permit this, the values of count at which the output is obtained from the decoders 17 and 18 must be switched over an increasing number of steps. To this end, a plurality of sets of decoders 17 and 18 in which the output is obtained at different values of the count may be provided and switched by the established order of harmonic for connection with the time counter 15. The provision of a plurality of sets of decoders 17 and 18 may result in a complicated arrangement, which can be avoided by alternative means of choosing the order of harmonic.

As will be understood by reference to FIGS. 2D and G, in the above description, the order of harmonic has been established by choosing the time interval $\Delta T_1$, $\Delta T_2$ or $\Delta T_3$ between the instants at which a pair of intermediate frequency outputs are obtained while maintaining the rate of the frequency sweep or the slope of the sawtooth wave shown in FIG. 2D constant, but alternatively by choosing a fixed time interval, for example, $\Delta T_1$, between the instants at which the pair of intermediate frequency outputs are obtained, the rate of the sweep or the slope of the sawtooth wave shown in FIG. 2D may be varied. In this instance, even though the position in time at which the time counter 15 has counted to a given count corresponding to the same time interval $\Delta T_1$ may be fixed, there may be obtained the intermediate frequency which passes through the gate 7, and thus the order of harmonic which is effective varied. By way of example, when changing the order of harmonic from $n = 4$ to $n = 5$, the rate of the frequency sweep may be reduced. A change in the rate of the frequency sweep can be achieved by varying the clock frequency supplied to the sawtooth wave generated counter 13 in accordance with the established order of harmonic while maintaining the frequency of the clock to the time counter 15 constant. Alternatively, the control voltage supplied to the voltage controlled oscillator 11 may be attenuated by means of the attenuator 12 in accordance with the established order of harmonic, as shown in FIG. 1.

Figure 5:
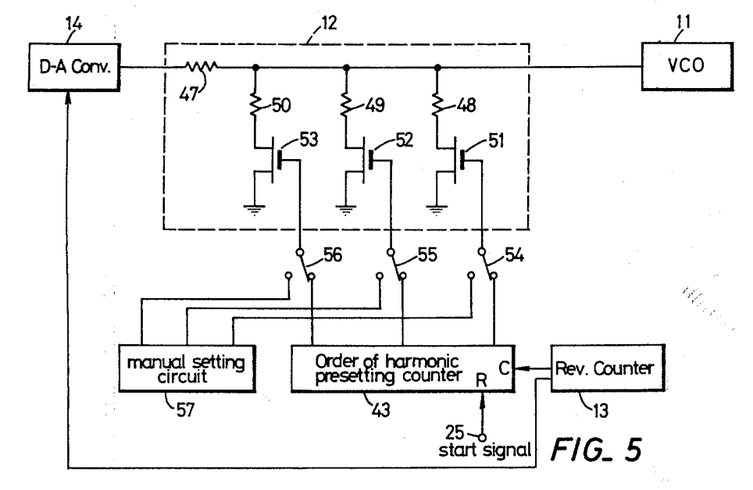
FIG. 5 is a circuit diagram showing one example of an attenuator determining the order of harmonic.

Specifically, an example of the attenuator 12 is shown in FIG. 5 wherein the D-A converter 14 has its output connected to the control input terminal of the voltage controlled oscillator 11 through a resistor 47 having a resistance R. The junction between the resistor 47 and the oscillator 11 is connected to ground through parallel paths each including resistor 48, 49 or 50 connected in series with a switching element in the form of a field effect transistor 51, 52 or 53, respectively. The resistance of the respective resistors 48, 49 and 50 is chosen to be R, R/2 and R/4, respectively. The arrangement is such that the input impedance which is presented when the D-A converter 14 is viewed from the attenuator 12 is substantially null while the output impedance when the oscillator 11 is viewed is substantially infinity. Assuming that all of the transistors 51, 52 and 53 are non-conductive, the output of the D-A converter 14 will be directly supplied to the oscillator 11. When the transistor 51 is conductive alone, the output of the D-A converter 14 will be attenuated to one-half before being supplied to the oscillator 11, while when both of the transistors 51 and 52 become conductive, the control voltage supplied to the oscillator 11 will be attenuated to one-third. Finally, when the transistor 53 is conductive alone, the control voltage to the oscillator 11 will be attenuated to a quarter. In this manner, the amount of attenuation depends on the conductive and non-conductive conditions of the transistors 51 to 53. The amount of attenuation is varied in accordance with the established order of harmonic, and it is also possible to update the established order of harmonic automatically where one established order of harmonic fails to trap the input signal.

The arrangement to perform this may comprise an order of harmonic presetting counter 43 which receives, as a count input, a carry output from the sawtooth wave generating counter 13 as it reaches its full count. The counter 43 is adapted to be reset by the start signal from the terminal 25. The counter 43 includes a plurality of stages, three in the example shown, the output of which has a weight coded in a binary fashion and which are connected through switches 54, 55, 56 to the gate of respective transistors 51, 52, 53. The arrangement is such that when the count in the counter 43 is zero, the transmission coefficient is unity; when the count is 1, the transmission coefficient is one-half; when the count is 2, the transmission coefficient is one-third and so on. In the above example, the count in the counter 43 is 3, so that $n = 4$ is chosen. If the system fails to trap the input signal under this condition, at the end of the period for the frequency sweep, a carry output is produced by the counter 13 and is supplied to the counter 43, advancing its count to 4, whereby the order of harmonic is established to be $n = 5$. During the subsequent frequency sweep, that intermediate frequency which is obtained by mixing with the fifth harmonic can be passed through the gate 7. In this manner, the established order of harmonic is successively updated. When it is desired to establish the order of harmonic manually, the switches 54 to 56 may be thrown to be connected with a manual setting circuit 57 incorporating a plurality of manual switches (not shown) which may be selectively operated to produce an output in the similar manner as the output from the counter 43.

The established order of harmonic may also be varied by changing the frequency of the clock supplied to the time counter 15 while maintaining the rate of the frequency sweep constant. This can be achieved by inserting in the input side of the gate 21 means for varying the clock frequency, for example, a clock frequency multiplying circuit, the multiplication factor of which may be varied in accordance with the established order of harmonic. By such an arrangement, the circuits 17 and 18 for decoding the count of the time counter 15 may be same and still the time interval $\Delta T$ until the given count is reached can be varied depending on the clock frequency, thus choosing a particular order of harmonic.

Figure 6:
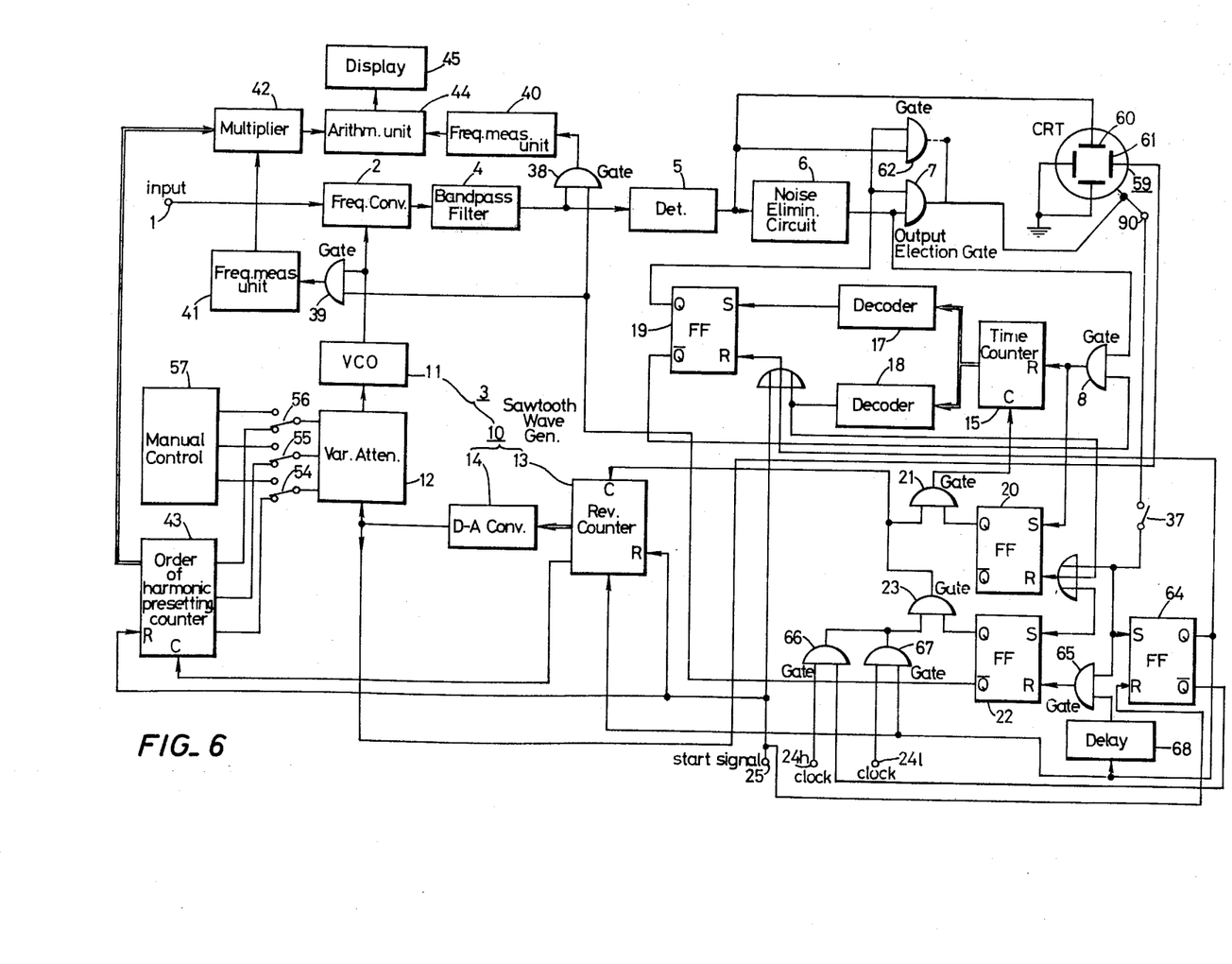
FIGS. 6 to 8 are block diagrams showing other embodiments of the heterodyne receiver system according to the invention.

In order to provide a display of the input signal frequency on a cathode ray tube, the output of the output election gate 7 may be applied to the vertical deflection means 60 of a cathode ray tube 59, with the output sawtooth wave voltage from the generator 10 applied to the horizontal deflection means 61 thereof, as shown in FIG. 1. By turning the switch 37 off, the operation of the overall system is prevented from being interrupted when the output is obtained from the gate 7, but can be repeated in an identical manner as before such output is obtained. A transparent dial having a horizontally extending frequency scale calibrated in terms of the orders of harmonic may be mounted on the faceplate of the cathode ray tube 59 to permit a reading of the input signal frequency. The frequency read from the frequency scale is offset from the input signal frequency by an amount corresponding to the intermediate frequency $Fi$, but the scale can be corrected previously to provide a direct reading of the input signal frequency. The transparent dial may be replaced as the established order of harmonic is changed. The set output of the flipflop 19 may be supplied as a gating signal to a gate 62, which when enabled, passes the output from the detector 5 to be fed to the vertical deflection means 60 of the tube 59 for displaying the pulse waveform prevailing at time $t_6$ of FIG. 2E, which corresponds to the waveform and level of the input signal. Alternatively, FIG. 6 shows that the output of the detector 5 is directly supplied to the vertical deflection means 60 and that the output of the gate 7 (or 62) is applied to a brightness modulation terminal 90 for a brightness modulation of the tube 59 so that the entire waveform shown in FIG. 2E is displayed, with the waveform occurring at time $t_6$ which corresponds to the input signal being displayed with an increased brightness. When a display by the tube 59 is used, since the switch 37 is turned off to repeat the frequency sweep, the abscissa of the display is swept between the minimum and maximum frequencies of the frequency sweep. The above mentioned display is advantageous in that only the input signal is displayed or it is displayed in a manner distinguishing it from the remainder as contrasted with the display provided by a conventional spectral analyzer in which all of the output from the detector 5 is displaced to make it difficult to discern which is the input signal.

With the heterodyne receiver system according to the invention, the means 43 permits a choice of only that output of the harmonic mixer 2 which is produced in response to a particular harmonic of the local oscillator signal. Such a choice and the sign in the frequency conversion processs which is determined by the direction of the frequency sweep enable an accurate determination of the frequency of the trapped input signal. Where the input signal can not be trapped, the setting in the means 43 is changed to permit a determination, over an extended frequency range, of which frequency the input signal is or to permit the input signal to be trapped and received with an extremely simple procedure and within a short period of time, together with the possibility that the frequency thereof may be displayed, if required. As mentioned above, the use of the clock control permits the established order of harmonic to be updated automatically in a facilitated manner. While the clock supplied to the counters 13 and 15 need not be identical, but if the same clock is used, the counting in the time counter 15 proceeds in a manner corresponding to a change in the oscillation frequency which is determined by the sawtooth wave counter 13 in response to the clock supplied, so that a variation in the time interval of the time counter 15 in reaching its given count which would result from a variation in the clock period accompanies a corresponding change in the local oscillator frequency to thus eliminate an error thereof, thus avoiding the need of an expensive crystal oscillator for the clock source. This feature permits the search of the input signal to be performed at a high rate and the rate to be switched to a lower one once the input signal is found, so as to trap the signal correctly to permit the determination of its frequency with a high accuracy.

Such an arrangement is illustrated in FIG. 6 wherein corresponding parts are designated by like numerals. In this instance, the sawtooth wave counter 13 comprises a reversible up-down counter, and operates as an up counter after it has been reset by the start signal from the terminal 25, thereby causing a frequency sweep of the oscillator 11 in the same manner as mentioned previously in connection with FIG. 1. If an input signal is trapped with a chosen order of harmonic, an output is obtained from the output election gate 7 and resets the flipflop 20 in the same manner as in FIG. 1, but the flipflop 22 is not reset immediately and instead the output of the gate 7 sets a flipflop 64. The flipflop 64 is reset by the start signal from the terminal 25, and its set output Q is supplied through a delay circuit 68 to a gate 65 as a gating signal. Thus the gate 65 is initially closed. The reset output $\bar{Q}$ of the flipflop 64 is applied as a gating signal to a gate 66, which therefore is enabled initially to pass a high rate clock from a terminal 24$h$ to be supplied to the gate 23, thus allowing the frequency sweep at a high rate. When later occurring one of the intermediate frequency outputs obtained during such sweep by virtue of the presence of the input signal is passed through the gate 7 in the manner mentioned above to set the flipflop 64, the set output Q thereof resets the flipflop 19 and also enables a gate 67, whereby a low rate clock from a terminal 24$l$ is passed through the gate 67 to be supplied to the gate 23. The set output Q of the flipflop 64 is supplied to the up-down switching terminal of the reversible counter 13, whereupon it is switched to operate as a down counter. As a consequence, where the oscillator 11 has a tendency such that the oscillation frequency will move past $Fl_2$ when the output is obtained from the output election gate 7 during the high rate sweep, the oscillation frequency is controlled to be reduced from such a frequency in excess of $Fl_2$ at a rate which is lower than that of the previous frequency sweep. When the frequency of the local oscillator 11 reaches $Fl_2$, the time counter 15 is reset and starts to count the clock which is supplied at a lower rate. When the given count is reached, a gating signal is supplied from the flipflop 19 to the gate 7, which produces the output since the oscillation frequency of the oscillator 3 is equal to $Fl_1$. The set output Q of the flipflop 64 is supplied through the delay circuit 68 as a gating signal to the gate 65, which passes the output derived from the gate 7 to reset the flipflop 22, thereby interrupting the operation of the overall system. AT this instant, the rate of the frequency sweep is low and the operation is interrupted at the moment the oscillator 11 has just reached $Fl_1$, without moving past it, and the oscillation is maintained at the frequency of $Fl_1$. In this manner, it is assured that the input signal frequency Fs be accurately determined. If the clock of a lower rate alone were used to operate the system, the rate with which the input signal is searched will be substantially retarded to thereby require a prolonged period of time, but the switching between the two kinds of clocks as mentioned above permits the input signal to be trapped with a short period of time and its frequency to be determined accurately. Additionally, because the sweep of the oscillator 11 is interrupted at the moment the equation (2) applies or when the input signal frequency is equal to $nFl_1 + Fi$, the arithmetic operation within the arithmetic unit 44 is an addition rather than a subtraction, whereby the arrangement required may be simplified. The use of both the high rate and low rate clocks by switching is permitted because the same clock is supplied to the both counters 13 and 15, thereby rendering the operation independent of fluctuations in time. The time delay in the delay circuit 68 is chosen such that when the flipflop 64 is set, the output obtained at that time from the gate 7 is prevented from being immediately passed through the gate 65.

Figure 7:
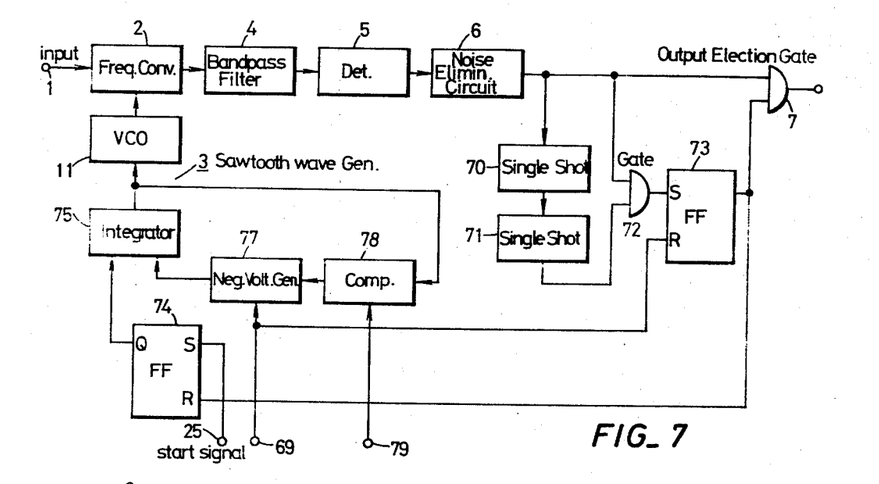

While in the above description, the time counter 15 has been used to choose one of the pair of the intermediate frequency outputs obtained in response to the input signal which occurs later in time, it may be replaced by a monostable multivibrator. This is illustrated in FIG. 7 wherein corresponding parts to FIG. 1 are designated by like reference numerals. The output pulse of the noise elimination circuit 6 (FIG. 2G) drives a monostable multivibrator 70 having a variable time from its drive until it is reset. The value of such time length is adjusted in accordance with the chosen order of harmonic, for example, adjusted equal to $\Delta T_1$ in FIG. 2. The trailing edge of the output from the multivibrator 70 drives another monostable multivibrator 71, producing a gate pulse having a suitably narrow width which enables a gate 72. If an output pulse is obtained from the circuit 6 during the period the gate 72 is enabled or during the time interval $\Delta T_1$ since the monostable multivibrator 70 is driven, that output pulse is passed through the gate 72 to set a flipflop 73. The set output of the flipflop 73 resets a flipflop 74, whereby an integrator 75 which has been integrating the set output Q thereof no longer receives an input to be integrated, thus maintaining its integral. The output from the integrator 75 controls the voltage controlled oscillator 11. The interruption of the integrating process effectively interrupts the frequency sweep. To return the integrator 75 to its initial condition, a reset signal is applied from a terminal 69 to a negative voltage generator 77, which produces a negative voltage supplied to the integrator 75, causing it to integrate such negative voltage. The decreasing output of the integrator is compared in a comparator 78 with a reference potential from a terminal 79, for examaple, ground potential, and when the equality applies therebetween, the comparator 78 produces an output which interrupts the supply of the output of the negative voltage generator 77 to the integrator 75. The start signal from the terminal 25 sets the flipflop 74, the set output of which is intrgrated in the integrator 75 for causing the frequency sweep of oscillator 11. In this example, the output election gate 7 is enabled by the set output of the flipflop 73.

In FIGS. 1, 6 and 7, where it is desired to use an integrating circuit for the sawtooth wave generator 10, the time constant of the integrating circuit or the voltage to be integrated can be varied in accordance with the established order of harmonic.

Figure 8:
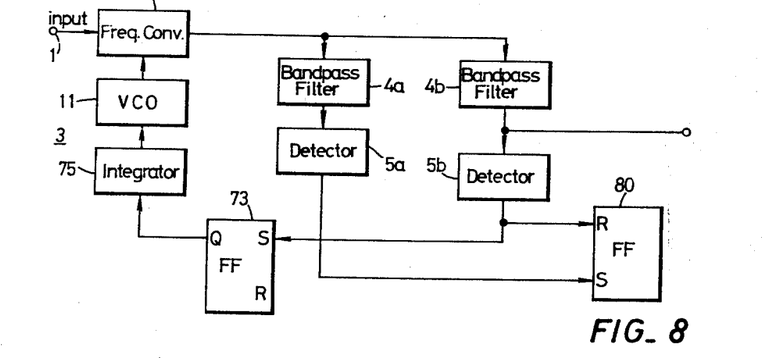

As a further modification, FIG. 8 shows the use of a single local oscillator 3 in combination with a pair of bandpass filters 4a and 4b providing different intermediate frequencies. The output from the respective filters 4a and 4b are detected by detectors 5a and 5b, respectively, and one of the outputs having the higher intermediate frequency Fia sets a flipflop 80 while the other output having the lower intermediate frequency Fib resets the flipflop 80 and also sets the flipflop 73 which functions to interrupt the frequency sweep. Assuming that Fia is obtained by the n-th harmonic of the local oscillator frequency $Fl_1$ and Fib is obtained by the n-th harmonic of the local oscillator frequency $Fl_2$, the following relationships apply:

$Fs = Fia + nFl_1$
$Fs = Fib + nFl_2$

Figure 9:
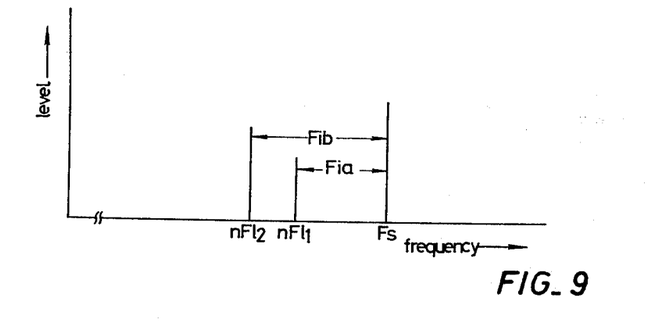
FIG. 9 is a diagram of frequency spectrum showing the relationship between the input signal frequency and the harmonic of the local oscillator signal used for the frequency conversion in the embodiment shown in FIG. 8.

Such relationships are illustrated in FIG. 9. The time interval $\Delta T$ required for the sweep from $Fl_1$ to $Fl_2$ is $\Delta T = (Fl_2 - Fl_1)t$, and therefore the following relationship is obtained:

$$\frac{\Delta T}{t} \cdot n = \left| Fia - Fib \right|$$

indicating a correspondence between $\Delta t$ aand $n$. By measuring the time interval $\Delta T$ from the acquistion of Fia to the acquisition of Fib, the order of harmonic, $n$, can be determined. Also in this arrangement, the output of the detector 5a or 5b may be supplied to the gate 72 and monostable multivibrator 70 in FIG. 7 to choose a particular value of $\Delta T$, thereby receiving only that input signal which corresponds to a desired value of $n$.

Having described the invention, what is claimed is:

1. A heterodyne receiver system for determining the frequency of an input signal, comprising means for receiving an input signal the frequency of which is to be determined, a frequency swept local oscillator for generating a local oscillator signal and harmonics thereof, a frequency converter responsive to said local oscillator signal and to said input signal and operative to provide a frequency mixing of the input signal frequency with the local oscillator signal frequency and its harmonic frequency, an intermediate frequency filter coupled to said converter for passing those outputs of the frequency converter which are of a predetermined intermediate frequency, an intermediate frequency detector coupled to said filter for detecting the occurrence of signals at said intermediate frequency, said filter producing a pair of time spaced signals at said intermediate frequency at different times in response to a same input signal and for a given order of harmonics of the local oscillator signal, means for extracting one signal of said pair of signals, which occurs at a given time interval after a first occurring one of said intermediate frequency signals thereby to elect said one of said pair of intermediate frequency signals which occurs later in time, and means response to the occurrence of said elected signal within said given time interval for determining the frequency of said input signal.

2. Heterodyne receiver system according to claim 1, further including a cathode ray tube having a vertical deflection means to which an output signal from said extracting means is supplied, and means for supplying a sweep control voltage to both the local oscillator and to a horizontal deflection means associated with the cathode ray tube.

3. Heterodyne receiver system according to claim 1, further including a cathode ray tube having a vertical deflection means, a horizontal deflection means, and a brightness modulation circuit, the output of the intermediate frequency detector being supplied to the vertical deflection means, means for supplying a sweep control voltage to both the local oscillator and to said horizontal deflection means, and means for coupling the elected one of said pairs of signals to the brightness modulation circuit.

4. Heterodyne reciver system according to claim 1 wherein said filter includes first and second intermediate frequency filters of different passband frequencies, means reponsive to the one of the outputs from the filters which occurs first in time for detecting the presence of the other intermediate frequency output at a given time interval after the occurrence of said one output, means for interrupting the sweep of the local oscillator in response to an output from the last mentioned means, and means for varying said time interval in accordance with a particular harmonic.

5. Heterodyne receiver system according to claim 1 in which the local oscillator comprises a sawtooth wave generator responsive to clock supplied for producing a stepped, sawtooth wave voltage in accordance with the number of clocks supplied, and a voltage controlled oscillator having a variable frequency which is controlled by the stepped output voltage from the sawtooth wave generator.

6. Heterodyne receiver system according to claim 5 in which the sawtooth wave generator comprises a counter for counting clocks, and a D-A converter for converting the count in the counter into an analog voltage.

7. Heterodyne receiver system according to claim 1, further including a noise elimination circuit for reciving the detector output and for eliminating signals below a given level.

8. Heterodyne receiver system according to claim 7 in which the noise elimination circuit comprises a peak detector to which the output of the intermediate frequency detector is supplied, and a comparator for comparing the output of the peak detector against the direct output of the intermediate frequency detector.

9. Heterodyne receiver system according to claim 1 wherein said last-named means includes means response to an output from said extracting means for interrupting the frequency sweep of the local oscillator.

10. Heterodyne receiver system according to claim 9, further including a first circuit coupled to said filter for determining the frequency of the output signal from said filter when the sweep of the local oscillator is interrupted, a second circuit coupled to said local oscillator for determining the oscillation frequency of the local oscillator when its sweep is interrupted, a multiplier coupled to said second circuit for multiplying the local oscillator frequency by a number corresponding to the established order of harmonic, an arithmetic unit coupled to said first circuit and to said multiplier and responsive to the product obtained in the multiplier and the determined value of the filter output signal frequency for calculating the frequency of the input signal, and means for providing a digital display of the result obtained in the arithmetic unit.

11. Heterodyne receiver system according to claim 9, further including a time counter for initiating counting of clocks in response to an output from said detector, an output election gate for receiving the output of the detector, and means for enabling said gate for a given period of time when the time counter has counted to a given count, and means for interrupting the sweep of the local oscillator being responsive to an output from the gate to interrupt said sweep.

12. Heterodyne receiver system acccording to claim 11 in which the local oscillator comprises a sawtooth wave generator for receiving a clock and for producing a voltage dependent on the supply of clocks thereto, and a voltage controlled oscillator having a variable frequency which is controlled by the output voltage from the generator, the clock supplied to the sawtooth wave generator being the same as that supplied to the time counter.

13. Heterodyne received system according to claim 11 in which the frequency swept local oscillator is operative to produce both an increasing voltage and a decreasing voltage by switching, said switching being effected by an output from the output election gate, and means for resetting the time counter, said means for interrupting the sweep of the local oscillator being responsive to an output obtained from the output election gate subsequent to the resetting of the time counter.

14. Heterodyne received system according to claim 13, furhter including means responsive to a change in the direction in which the output voltage of said local oscillator varies, to switch the clock supplied to the counter from a previous clock to a clock of lower rate and for concurrently reducing the rate of the sweep of the local oscillator.

15. Heterodyne receiver system according to claim 1, further including means couplled to said local oscillator for establishing the order of harmonic of the local oscillator signal which controls the operation of the system.

16. Heterodyne receiver system according to claim 15 in which the means for establishing the order of harmonic comprises means for varying a time interval between the occurrence of the signals in said pair of signals which are obtained with the same order of harmonic of the local oscillator signal as it is frequency swept.

17. Heterodyne receiver system according to claim 15, further including a time counter for initiating a counting of clock in response to the occurrence of an output from the detector, an output election gate for receiving the detector output, and means for enabling said gate for a given period of time when the time counter has counted a given count, said means for establishing the order of harmonic including means for varying the frequency of the clock supplied to the time counter in accordance with a choice of an order or harmonic.

18. Heterodyne receiver system according to claim 15, further including means for detecting the end of each frequency sweep period of the local oscillator, and means for updating an order of harmonic to be established by the order of harmonic establishing means in response to an output from the detecting means.

19. Heterodyne receiver system according to claim 15 in which the means for establishing the order of harmonic comprises means for varying the rate with which the local oscillator is swept.

20. Heterodyne receiver system according to claim 19 in which the local oscillator comprises a sawtooth wave generator for receiving a clock and for producing a sawtooth wave voltage which varies with the number of clocks supplied, and a voltage controlled oscillator having a variable frequency which is controlled by the sawtooth wave voltage, said means for establishing the order of harmonic comprising means operative to vary the frequency of the clock supplied to the sawtooth wave generator in accordance with a selected order of harmonic.

21. Heterodyne receiver system according to claim 19 in which the local oscillator comprises a sawtooth wave generator, and a voltage controlled oscillator having a variable frequency which is controlled by the output of the generator, said means for establishing the order of harmonic comprising a variable attenuator for attenuating the sawtooth wave voltage supplied to the voltage controlled oscillator in accordance with the established order of harmonic.

22. Heterodyne receiver system according to claim 21 in which the sawtooth wave generator comprises a counter for counting a clock, and a D-A converter for producing a voltage which correspond to the count in the counter, and further including another counter for counting the final carry output of the first mentioned counter to establish an order of harmonic, said attentuator having an attenuation coeffecient which is varied in accordance with the count in said another counter for attenuating the sawtooth wave voltage.

* * * * *